United States Patent [19]
Fujimoto et al.

[11] Patent Number: 4,877,173
[45] Date of Patent: Oct. 31, 1989

[54] WIRE BONDING APPARATUS

[75] Inventors: Hitoshi Fujimoto; Hisao Masuda, both of Itami, Japan

[73] Assignee: Mitsubishi Denki Kabushiki Kaisha, Japan

[21] Appl. No.: 275,604

[22] Filed: Nov. 23, 1988

Related U.S. Application Data

[63] Continuation of Ser. No. 80,875, Aug. 3, 1987, abandoned.

[30] Foreign Application Priority Data

Aug. 6, 1986 [JP] Japan ................................. 61-185740

[51] Int. Cl.$^4$ ............................................. B23K 20/10
[52] U.S. Cl. ..................................... 228/1.1; 228/4.5; 228/110
[58] Field of Search ................. 228/1.1, 4.5, 110, 904; 157/73.1; 73/570, 662

[56] References Cited

U.S. PATENT DOCUMENTS

| | | | |
|---|---|---|---|
| 3,794,236 | 2/1974 | Salzer et al. | 228/1.1 |
| 4,249,986 | 2/1981 | Obeda | 228/1.1 |
| 4,566,181 | 1/1986 | Matusik et al. | 29/602.1 |
| 4,641,773 | 2/1987 | Morino et al. | 228/1.1 |

OTHER PUBLICATIONS

Metals Handbook Ninth Edition, vol. 3, "Low Expansion Alloys", pp. 792-794, copy 1980.
"Operation and Maintenance Manual for the Model 10G Ultrasonic Controller and Ferroelectric Transducer Assembly", UtheTechnology, Inc., Jan. 1985.

*Primary Examiner*—Nicholas P. Godici
*Assistant Examiner*—Samuel M. Heinrich
*Attorney, Agent, or Firm*—Leydig, Voit & Mayer

[57] ABSTRACT

A wire bonding apparatus which bonds electrodes and external leads of a semiconductor integrated circuit element, a bonding head, a heat block having a lead frame which supports the semiconductor integrated circuit element in a bonding position, and an ultrasonic horn fixed to the bonding head and generating ultrasonic waves to bond the electrodes and the external leads of the circuit element when the circuit element is in the bonding position, the ultrasonic horn being formed of a metallic material having a thermal expansion coefficent of not more than about $5 \times 10^{-6}/°C$. so as to limit locational errors of the ultrasonic horn due to thermal expansion to a specified value.

7 Claims, 1 Drawing Sheet

WIRE BONDING APPARATUS

This application is a continuation of application Ser. No. 07/080,875 filed Aug. 3, 1987 now abandoned.

BACKGROUND OF THE INVENTION

This invention relates to a wire bonding apparatus for connecting between electrodes and external leads of semiconductor integrated circuit elements, such as ICs or LSI circuits, by bonding wires placed in position by appropriate ultrasonic waves from an ultrasonic horn.

In the assembly of semiconductor integrated circuit elements, a wire bonding step is included for connecting between the electrodes of a semiconductor pellet and the external leads of the circuit elements. Conventionally, a wire bonding apparatus has been used. Ultrasonic wave oscillation from an ultrasonic horn is provided to place a bonding wire between the electrodes of the semiconductor pellet located in the center of a lead frame supported on a heat block and the external leads.

However, the wire bonding step is very delicate and requires a wire bonding apparatus capable of performing very precise operations, for instance, contact bonding a 100 um diameter wire ball to a 100 um square aluminum pad. It is therefore necessary to minimize locational errors with regard to respective positions of the semiconductor pellet, the external leads, and the wire bonding apparatus.

For keeping the locational errors within a predetermined tolerance, certain design changes in the wire bonding apparatus of the prior art have been considered, such as making the operating pitch of an X-Y table closer or pattern recognition resolution finer. However, there are limitations in the above design changes, and, therefore, with the miniaturization of the electrode (the semiconductor pellet) in recent years, conventional wire bonding apparatus have had problems in that it is impossible to keep the locational error of the bonding location within a tolerance of about 5 $\mu$m.

SUMMARY OF THE INVENTION

Accordingly, it is an object of the present invention to provide a wire bonding apparatus which can respond to the requirements according the above miniaturization of electrodes in recent years.

In accordance with the wire bonding apparatus of the present invention, an ultrasonic horn thereof is made of a metallic material having a thermal expansion coefficient of not more than about $5 \times 10^{-6}/°C$.

The wire bonding apparatus of the present invention can keep the positioning error of the bonding location within about 5 $\mu$m.

DESCRIPTION OF THE PREFERRED EMBODIMENT

Figure 1:
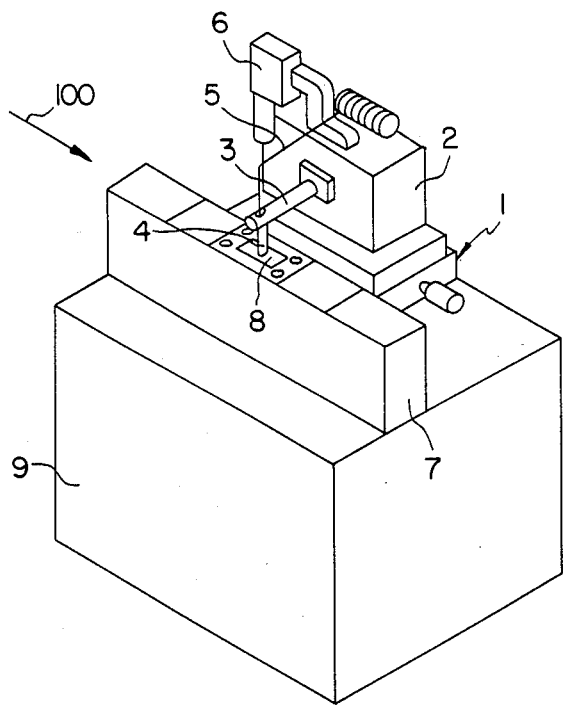
FIG. 1 is a perspective view of the whole wire bonding apparatus of the present invention.
Figure 2:
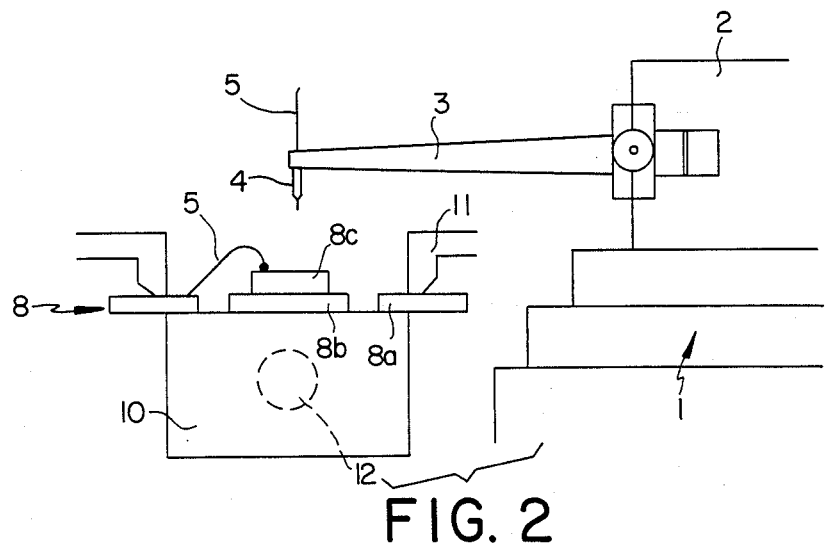
FIG. 2 is a partial enlarged view of elements of the above wire bonding apparatus in the bonding step.

FIG. 1 is a perspective view of the whole wire bonding apparatus of the present invention. An X-Y table 1 moves in two (X and Y) directions within a plane to transfer a bonding head 2 disposed thereon. An ultrasonic horn 3 is fixed to the bonding head 2 and has a bonding capillary tip 4 at the end thereof. A bonding wire 5 is delivered from the bonding capillary tip 4. The ultrasonic horn 3 is formed of a metallic material having a very low thermal expansion coefficient, e.g., nickel steel (36% Ni:Invar) of which the thermal expansion coefficient is $0.9 \times 10^{-6}/°C$. This nickel steel is usually called "Invar" and contains nickel in the proportion of 36%. The length of the ultrasonic horn 3 is generally from $80 \times 10^3$ to $100 \times 10^3$ $\mu$m. An ITV camera 6 is fixed to a top of the bonding head 2. A lead frame on a frame feeder 7 moves in the direction of arrow 100 on a table 9 to feed a semiconductor integrated circuit element 8 under the bonding capillary tip 4 of the ultrasonic horn 3. FIG. 2 is a partial enlarged view of elements of the wire bonding apparatus in the bonding step. In FIG. 2, the semiconductor integrated circuit element 8 is held on a heat block 10 by a frame clamp 11 and comprises a lead frame 8a, a die pad 8b, and an IC pellet 8c. The heat block 10 includes a heater 12. The die pad 8b is located in the center of the lead frame 8a and separated from the external leads (not shown) which extend from the lead frame 8a. The IC pellet 8c is fixed (die-bonded) on the die pad 8b.

In such a wire bonding apparatus, since the ultrasonic horn 3 (having length of not more than $100 \times 10^3$ $\mu$m) is formed of a metallic material having a very low thermal expansion coefficient, e.g., Invar or an alloy thereof, stretch in the ultrasonic horn 3 due to thermal expansion can be kept within about 5 $\mu$m, that is, locational error of the bonding location can be kept within 5 $\mu$m.

Figure 3:
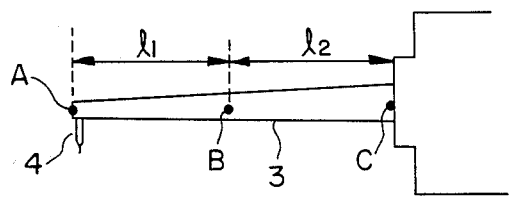
FIG. 3 is a side view of the ultrasonic horn 3, for explaining the limitation of the thermal expansion coefficient by example.

The reason why the thermal expansion coefficient of the material of the ultrasonic horn 3 is limited to not more than $5 \times 10^{-6}/°C$. is as follows. FIG. 3 is a side view of the ultrasonic horn 3 for explaining the above limitation of the thermal expansion coefficient by example. In FIG. 3, points A,B,C indicate the heat point, the middle point and the root point of the ultrasonic horn 3, respectively, and $l_1$ and $l_2$ indicate the length from point A to point B and the length from point B to point C, respectively. In this example, the full length of the ultrasonic horn 3 (the length from point A to point C) is $84 \times 10^3$ $\mu$m, accordingly $l_1$ and $l_2$ are $42 \times 10^3$ $\mu$m, respectively. Since the head portion of the ultrasonic horn 3 is affected more by the heat from the heat block 10 than is the root portion, the stretch in the ultrasonic horn 3 will be considered by way of dividing the ultrasonic horn 3 into two portions. TABLE 1 below shows the temperature rise at the point A,B,C of the ultrasonic horn 3 during wire bonding.

TABLE 1

| | [°C.] | | |
| --- | --- | --- | --- |
| | point A | point B | point C |
| during bonding | 80 | 50 | 29 |
| before bonding | 47 | 29 | 24 |
| difference | 33 | 21 | 5 |

When the ultrasonic horn 3 is formed of stainless steel (SUS 304) having a thermal expansion coefficient $\alpha_S$ (where $\alpha_S = 1.6 \times 10^{-5}/°C$.) which has been used in the prior art, the respective lengths of stretch (extension) $l_1$, $l_2$ of the head portion and the root portion of the ultrasonic horn 3 are as follows:

$$l_1' = \alpha_S \times l_1 \times T_1$$
$$= (1.6 \times 10^{-5}) \times (42 \times 10^3) \times \{(33 + 21)/2\} = 18 \, \mu m$$
$$l_2' = \alpha_S \times l_2 \times T_2$$
$$= (1.6 \times 10^{-5}) \times (42 \times 10^3) \times \{(5 + 21)/2\} = 8.7 \, \mu m$$

(where $T_1$, $T_2$ are respective mean temperature differences.)

Accordingly, the total stretch $(l_1' + l_2')$ is 26.7 $\mu m$. However, when the ultrasonic horn 3 is formed of a material having a thermal expansion coefficient $\alpha$ where $(\alpha = 5 \times 10^{-6}/°C.)$ as in the present invention, the total stretch $(l_1' + l_2')$ is only 8 $\mu m$. When the length of total stretch must be kept within 5 $\mu m$, a material having a thermal expansion coefficient $\alpha$ where $\alpha = 3 \times 10^{-6}/°C.$ should be used. However, even when a material having a thermal expansion coefficient of $\alpha = 5 \times 10^{-6}/°C.$ is used, equal effects can result by suitably selecting the length of the ultrasonic horn 3 and the size and/or the material of the other parts.

Accordingly, the wire bonding apparatus of the present invention can satisfy the demands of recent years on the locational error constraint resulting from miniaturization of the electrode. Further, since high accuracy wire bonding is achieved, improvement in the quality of IC products can also be accomplished.

The action of the wire bonding apparatus in the bonding step is as follows. Firstly, the lead frame 8a, to the center of which the IC pellet 8c is contact bonded, is held on the heat block 10 by the frame clamp 11. Next the IC element 8 is disposed at a predetermined position for bonding (positioning controlled) automatically by use of ITV camera 6, and after moving the bonding capillary tip 4 of the ultrasonic horn 3 over the electrode of the IC pellet 8c by way of shifting the X-Y table 1, the ultrasonic horn 3 is lowered, and the bonding wire 5 is pressed against the electrode of the IC pellet 8c by the ultrasonic horn 3 to apply the ultrasonic wave, thereby bonding the wire 5 to the electrode. Then, the ultrasonic horn 3 is raised and at the same time the X-Y table 1 is shifted, so that the other end of the bonding wire 5 can be bonded to the external lead terminal of the lead frame 8a. After a time, the tip portion of the bonding wire 5 takes on a globular shape, completing the process. In practice, since the IC pellet 8c has a lot of terminals, the above process is repeated many times. Wiring by use of ultrasonic waves and thermocompression bonding is embodied as above.

In the above embodiment, only the ultrasonic horn 3 is formed of a metallic material having a low thermal expansion coefficient. In the field of the precision assembly, it is most important to maintain high accuracy by preventing displacement caused by heat. Therefore, if other constructional elements of the wire bonding apparatus, e.g., the heat block 10 and the frame clamp 11, which are directly affected by the heat, are also formed of a metallic material having a very low thermal expansion coefficient, increased accuracy in positioning control can be achieved.

What is claimed is:

1. A wire bonding apparatus which bonds electrodes and external leads of a semiconductor integrated circuit element, said wire bonding apparatus comprising:
   a heat block having a lead frame which supports the semiconductor integrated circuit element in a bonding position; and
   an electronic horn fixed to a bonding head and generating ultrasonic waves to bond the electrodes and the external leads when the circuit element is in the bonding position, said ultrasonic horn being formed of a metallic material having a thermal expansion coefficient (TEC) of a maximum of $5 \times 10^{-6}/°C.$ and having a head portion and a root portion from a lengthwise midpoint, said head and root portions having a maximum length of $50 \times 10^3$ $\mu m$ after thermal expansion, and said ultrasonic horn and heat block being operated to generate a maximum bonding temperature in said head portion of 80° C. during bonding, said head portion having an actual length which is inversely proportional with the TEC at a mean temperature difference between temperature during bonding and temperature before bonding, the head and root portions having an actual length before thermal expansion which limits locational errors of said horn due to thermal expansion to a maximum value of 5 $\mu m$.

2. A wire bonding apparatus as claimed in claim 1 wherein said metallic material is Invar.

3. A wire bonding apparatus as claimed in claim 1 wherein said heat block is made of a metallic material having a thermal expansion coefficient of not more than about $5 \times 10^{-6}/°C.$ 4. A wire bonding apparatus as claimed in claim 3 wherein said heat block is made of Invar.

5. A wire bonding apparatus as claimed in claim 1 further including a frame clamp is made of a metallic material having a thermal expansion coefficient of not more than about $5 \times 10^{-6}/°C.$ 6. A wire bonding apparatus as claimed in claim 5 wherein frame clamp is made of Invar.

7. A wire bonding apparatus comprising:
   a table movable in a horizontal plane;
   a bonding head supported on said table;
   a frame feeder including a heat block having a lead frame for supporting a semiconductor integrated circuit element at the center thereof, said frame feeder being movable in a predetermined direction for bringing the circuit element to a specified position; and
   an ultrasonic horn fixed to a bonding head and having a capillary tip at an end thereof and generating ultrasonic waves to bond electrodes and external leads of the circuit element, said ultrasonic horn being formed of a metallic material having a thermal expansion coefficient (TEC) of a maximum of about $5 \times 10^{-6}/°C.$ and having a head portion and a root portion from a lengthwise midpoint, said head and root portions having a maximum length of $50 \times 10^3$ $\mu m$ after thermal expansion, and said ultrasonic horn and heat block being operated to generate a maximum bonding temperature in said heat portion of 80° C. during bonding, said head portion having an actual length which is inversely proportional with the TEC at a mean temperature difference between temperature during bonding and temperature before bonding, the head portions and root having an actual length before thermal expansion which limits locational errors of said horn due to thermal expansion to a maximum value of 5 $\mu m$.

* * * * *